US011276910B2

(12) United States Patent
Shin

(10) Patent No.: US 11,276,910 B2
(45) Date of Patent: Mar. 15, 2022

(54) SUBSTRATE INTEGRATED WAVEGUIDE AND METHOD FOR MANUFACTURING THE SAME

(71) Applicant: SEMICONDUCTOR COMPONENTS INDUSTRIES, LLC, Phoenix, AZ (US)

(72) Inventor: Kiryung Shin, Chandler, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 16/947,275

(22) Filed: Jul. 27, 2020

(65) Prior Publication Data
US 2020/0358161 A1 Nov. 12, 2020

Related U.S. Application Data

(63) Continuation of application No. 16/050,991, filed on Jul. 31, 2018, now Pat. No. 10,749,237.

(51) Int. Cl.
*H01P 3/12* (2006.01)
*H01P 11/00* (2006.01)
(Continued)

(52) U.S. Cl.
CPC .............. *H01P 3/121* (2013.01); *H01L 23/66* (2013.01); *H01P 1/2088* (2013.01);
(Continued)

(58) Field of Classification Search
CPC .... H01P 1/2088; H01P 11/002; H01P 11/003; H01P 3/121
(Continued)

(56) References Cited

U.S. PATENT DOCUMENTS 5,982,256 A 11/1999 Uchimura et al.
2011/0018657 A1 1/2011 Cheng et al.
(Continued)

FOREIGN PATENT DOCUMENTS

CN 105932379 A 9/2016

OTHER PUBLICATIONS

Qorvo Applications Engineering Staff, "GaAs and GaN Die Assembly and Handling Procedures," White Paper, Apr. 3, 2017.
(Continued)

*Primary Examiner* — Rakesh B Patel
(74) *Attorney, Agent, or Firm* — Brake Hughes Bellermann LLP

(57) ABSTRACT

A method for manufacturing a substrate integrated waveguide for a millimeter wave signal is disclosed. In the method, a gold layer is disposed on a top surface of the silicon substrate using a lift-off process. Next, two parallel rows of substantially equal spaced vias are formed in the silicon substrate using a through-silicon-via etching process. Then, a copper layer is disposed on the bottom side of the silicon substrate and on interior surfaces of each via. The separation between the copper layer and the gold layer define a height of the substrate integrated waveguide, while the separation between the two parallel rows of substantially equal spaced vias define a width of the substrate integrated waveguide. In some implementations the length of the substrate defines a length of the substrate integrated waveguide, and the length, width, and height define a resonator that is resonant at a millimeter wave frequency.

20 Claims, 10 Drawing Sheets

(51) Int. Cl.
    *H01P 1/208*    (2006.01)
    *H05K 3/42*     (2006.01)
    *H05K 3/00*     (2006.01)
    *H01L 23/66*    (2006.01)

(52) U.S. Cl.
    CPC ............ *H01P 11/002* (2013.01); *H05K 3/002* (2013.01); *H05K 3/42* (2013.01)

(58) Field of Classification Search
    USPC ................................................ 333/208, 248
    See application file for complete search history.

(56) References Cited

U.S. PATENT DOCUMENTS

| | | |
|---|---|---|
| 2013/0154759 A1 | 6/2013 | Morita et al. |
| 2016/0276729 A1 | 9/2016 | Dang et al. |

OTHER PUBLICATIONS

MicroChemicals, "Lift-off Processes with Photoresists," Rev. Nov. 7, 2013, Source: www.microchemicals.com/downloads/application_notes.html.
U.S. Appl. No. 16/050,991, filed Jul. 31, 2018.

SUBSTRATE INTEGRATED WAVEGUIDE AND METHOD FOR MANUFACTURING THE SAME

CROSS-REFERENCE TO RELATED APPLICATION

This application is a continuation of U.S. patent application Ser. No. 16/050,991, filed on Jul. 31, 2018, which is hereby incorporated by reference in its entirety.

FIELD OF THE DISCLOSURE

The present disclosure relates generally to silicon processing and more specifically, to a silicon (Si) manufacturing method for manufacturing a substrate integrated waveguide (SIW) for an electromagnetic signal in a millimeter wave (mmW) band.

BACKGROUND

Fifth generation (5G) wireless standards specify signals in a millimeter wave (mmW) band (e.g., around 28 gigahertz (GHz)) that is about 10 times higher than the frequencies typically used for cellular communication. A wireless communication apparatus (e.g., smartphone) operating in, or around, this mmW band may require a substrate integrated waveguide (SIW) for guiding and/or processing mmW signals in this band.

SUMMARY

In one general aspect, the present disclosure describes a method for manufacturing a SIW. In the method, a gold layer is disposed on a top surface of a substrate (e.g., high resistivity silicon substrate) using a lift-off process. Next, two parallel rows of equal (or substantially equal) spaced vias that are separated by a width of the substrate integrated waveguide are formed in the silicon substrate using a through-silicon-via etching process. Then, a copper layer is disposed on the bottom side of the silicon substrate and on interior surfaces of each via. The copper layer and the gold layer are separated by a height of the substrate integrated waveguide.

In a possible implementation, the SIW is configured as a resonator that resonates at a frequency in a mmW band (e.g., 27-29 GHz) with a high Q (e.g., >100). The gold layer on the top surface of the SIW is compatible with packaging (e.g., wire bonding) with a GaN die. Accordingly, in possible implementations, the SIW can be packaged with a GaN die. Additionally, the packaged SIW may, in possible implementations, be integrated with a wireless apparatus for applications such as communication (e.g., 5G wireless communication) or sensing (e.g., automotive radar).

In another general aspect, the present disclosure describes a substrate integrated waveguide (SIW). The SIW includes equal spaced (or substantially equal spaced) vias that are etched in a silicon substrate (e.g., using a through-silicon-via etching process). A gold layer is disposed on a top surface of the silicon substrate (e.g., using a lift-off process), and a copper layer is disposed on a bottom surface of the silicon substrate and on interior surfaces of each via (e.g., using a redistribution line (RDL) process). The separation between the copper layer and the gold layer defines a height of the SIW, and the equal (or substantially equal) spaced vias include vias that are arranged in a first pair of parallel rows. The first pair of parallel rows is separated by a separation that defines a width of the SIW.

In another general aspect, the present disclosure describes a wireless communication device. The wireless communication device includes a gallium nitride (GaN) die and a resonator. The resonator is packaged with the GaN die and includes a silicon (Si) substrate that has a gold layer disposed on a top surface (e.g., using a lift off process). The resonator further includes a first pair of parallel rows of equal (or substantially equal) spaced vias formed in the silicon substrate (e.g., using a through silicon via etching process), and a separation between the first pair of parallel rows of equal (or substantially equal) spaced vias defines a width of the resonator. The resonator further includes a second pair of parallel rows of equal (or substantially equal) spaced vias in the silicon substrate, and a separation between the second pair of parallel rows of equal (or substantially equal) spaced vias defines a length of the resonator. The resonator further includes a copper layer that is disposed on the bottom side of the silicon substrate and on an interior surface of each via (e.g., using an RDL process). The separation between the gold layer and the copper layer define a height of the resonator. The resonator is resonant at a millimeter wave frequency (i.e., based on the length, the width, and the height of the resonator).

The foregoing illustrative summary, as well as other exemplary objectives and/or advantages of the disclosure, and the manner in which the same are accomplished, are further explained within the following detailed description and its accompanying drawings.

DETAILED DESCRIPTION

The present disclosure describes a GaN-compatible, silicon manufacturing process to manufacture a substrate integrated waveguide (SIW) that is suitable for use with an electromagnetic signal in a millimeter wave (mmW) band. The disclosed SIW manufacturing process addresses shortfalls associated with existing technology for manufacturing a SIW for use with mmW signals. For example, it is difficult to obtain the sizes and tolerances necessary for a mmW signals using a traditional Si RF integrated passive device (IPD) process. While custom processes, such as those used for producing micro-electro-mechanical systems (MEMS), may offer more precision, they are generally too costly and time-inefficient for a high-volume market (e.g., 5G communication device market). Thus, some advantages of the disclosed SIW manufacturing process are precision and compatibility with high-volume production. Additionally, the disclosed manufacturing process can produce a SIW that is easily packaged with a gallium nitride (GaN) die. This packaging aspect is desirable because active components (e.g., power amplifiers) for use in mmW bands are often based on GaN based materials.

Figure 1A:
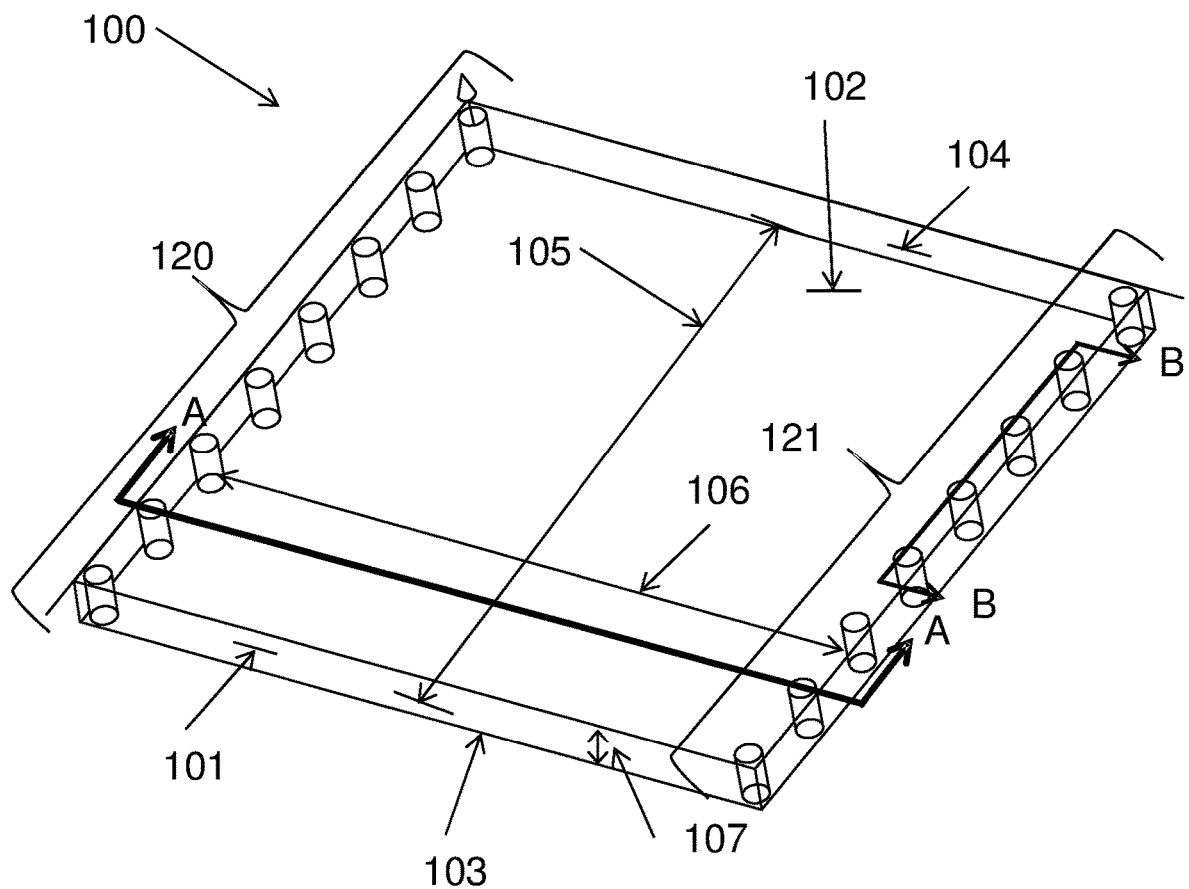
FIG. 1A is a perspective view of a substrate integrated waveguide (SIW) according to an implementation of the present disclosure.

A SIW 100 is shown in FIG. 1A. Generally, the SIW includes a silicon (Si) substrate that has a top conductor 102, which is a layer of conductive material (e.g., gold) disposed on the top surface of the substrate. The SIW also includes a bottom conductor 103, which is a layer of conductive material (e.g., copper) disposed on a bottom surface of the substrate. The SIW 100 also includes two parallel rows of conductive (i.e., plated) vias 120, 121 that are separated by a width 106 of the SIW and that extend along a length 105 of the SIW (i.e., along the side edges of the SIW).

Figure 1B:
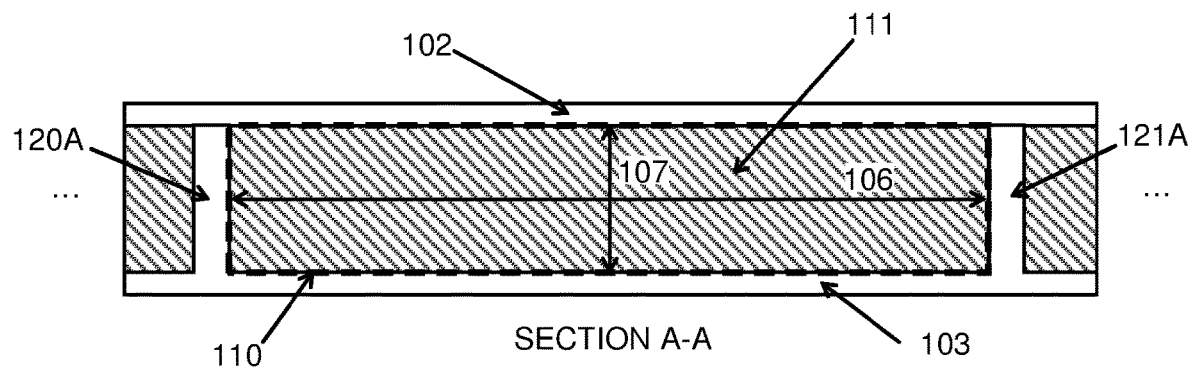
FIG. 1B is a first cross sectional view of the SIW of FIG. 1A.

A first cross sectional (i.e., section A-A) view of the SIW of FIG. 1A is shown in FIG. 1B. In operation, an electromagnetic signal is contained within a guide area 110 including the substrate 111. The height 107 of the SIW is defined by the separation between the top conductor 102 on the top surface of the substrate and the bottom conductor 103 on the bottom surface of the substrate. The width 106 of the SIW is defined by the separation between vias 120A, 121A in the two parallel rows of vias. The height 107 and/or width 106 of the SIW typically remain constant over the length 105 of the SIW but in certain applications (e.g., transitions, filters, etc.) may change over the length of the guide. Additionally, in some applications, the substrate 111 may extend beyond the guide area 110.

Figure 1C:
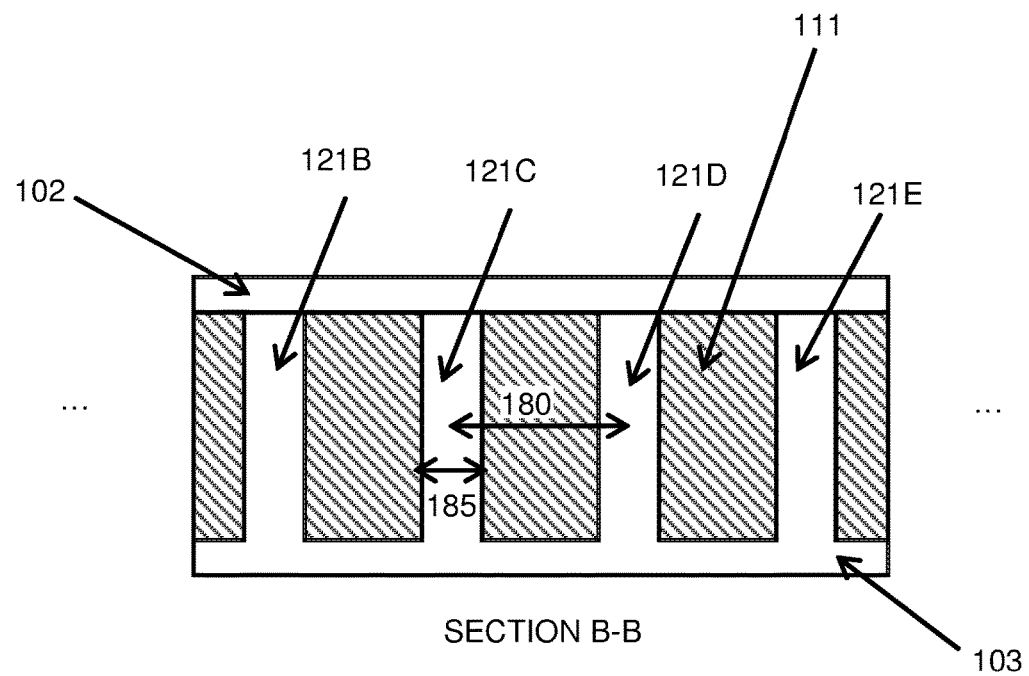
FIG. 1C is a second cross sectional view of the SIW of FIG. 1A.

A second cross sectional (i.e., section B-B) view of the SIW of FIG. 1A is shown in FIG. 1C. The spacing 180 (i.e. pitch) between adjacent vias in a row (e.g., 121C, 121D) is selected so that the row of vias appear as a uniform, conductive wall to a guided mmW signal. This is accomplished by making the pitch of the vias small relative to a wavelength of the mmW signal in the substrate. In other words, closely spaced vias have less loss from leakage than do vias spaced farther apart.

As shown in FIG. 1C, a row of vias 121B, 121C, 121D, 121E is typically regularly spaced and act as a side wall of the SIW. Each via is typically the same diameter (d) 185 and the spacing between the vias 180 (i.e., the pitch (p)) is typically measured from via center-to-center. To prevent leakage, the pitch is selected to be a fraction of the wavelength of the electromagnetic signal within the substrate (e.g., $p \leq \lambda/4$), and the diameter of each via may be selected as a fraction of the pitch (e.g., $p/3 \leq d \leq 2p/3$).

A given pitch may prevent leakage for a range of frequencies. For example, a via pitch 180 of 250 micrometers (μm) and a diameter 185 of 150 μm may provide good containment of electromagnetic signals in a high resistivity Si substrate, with a dielectric constant ($\varepsilon_r$) of greater than 10 (e.g., 11.9), for frequencies of around 86 GHz ($\lambda/4 \approx 252$ microns) or less. The lower limit of the frequencies contained is based on the cutoff frequency of the SIW, which depends on the dimensions (e.g., width 106) of the guide area 110.

Returning to FIG. 1A, the spacing between the vias in each row 120, 121 along the guide length 105 is ideally uniform (i.e., equal), but in practice may be substantially uniform (e.g., less than 10% spacing variation). A via in the first row 120 of the two parallel rows typically corresponds spatially to a via in a second row 121 of the two parallel rows (i.e., the rows are symmetrical); however, variations may exist. For example, the leakage loss is low as long as the pitch of the vias is less than a quarter wavelength. Thus, small variations in pitch may not affect the overall leakage loss significantly as long as the pitch remains less than a quarter wavelength. Additionally, in some cases, the spacing between adjacent vias in one or more areas along a row of vias may be varied intentionally (e.g., made intentionally large) to couple the electromagnetic signal in/out of the SIW. The uniform spacing/arrangements as well as the variations described are all within the scope of the present disclosure.

The basic SIW structure of FIG. 1A may be configured and/or adapted for a variety of mmW applications. In one application, a SIW structure may be configured as a waveguide to convey the electromagnetic signal from a front surface 101 to a back surface 104. The SIW may guide an electromagnetic signal along a straight line or along a curved line. A curved SIW may be thought of as a collection of straight SIWs (such as the unit cell SIW shown in FIG. 1A) that are arranged at angles. Therefore, curved SIW are within the scope of the present disclosure. Likewise, variations in guide dimensions and/or via spacing for other applications (e.g., antennas, filters, dividers, matching stubs, and couplers) may be considered variations of the SIW shown in FIG. 1A and are, therefore, within the scope of the present disclosure. In general, the present disclosure envisions all applications related to variations of the basic SIW structure shown in FIG. 1A as compatible with the manufacturing methods described herein.

At least one particular application of interest for wireless applications (e.g., communication, sensing, etc.) is the resonator, which can be used for generating or filtering a particular wavelength (or wavelengths) in a mmW band. Dimensions and materials of SIW of FIG. 1 may be chosen to form a resonant cavity that contains electromagnetic waves. At resonance, the electromagnetic waves reflect between the walls of the cavity to form standing waves at the resonant frequency. The SIW of FIG. 1A may be configured as a resonator. For example, the SIW of FIG. 1A may be configured as a cavity resonator with the addition of a row of vias along the front surface 101 and a row of vias along the back surface 104. The additional two rows are orthogonal to the rows 120, 121 of the SIW but are otherwise similar (e.g., same via pitch, same via diameter, etc.). The vias and the top and bottom conductors of the SIW define a cavity that is resonant at a particular wavelength (i.e., frequency) within the substrate. The wavelength size within the substrate is based on the dielectric constant of the substrate ($\varepsilon_r$). For resonance the length, width, and height of the resonator may correspond to the wavelength of the resonant frequency (e.g., $\lambda/2$).

In some implementations, the SIW resonator may have one or more ports on one or more sides of the resonant cavity. For example, the resonator may have a first port at a front surface 101 of the SIW and/or a second port at back surface 104 of the SIW. Signals may be coupled in and out of the resonator at the ports (e.g., through the use of a probe or aperture).

The electromagnetic signal is contained within the resonator by the top conductor 102, by the bottom conductor 103, and by the rows of vias along the sides. In some implementations, electromagnetic leakage (i.e., losses) at the front surface 101 and/or back surface 104 may be prevented or minimized with a row of equal (or substantially equal) spaced vias that extend over all or a portion of the width 106 of the front 101 and/or back 104 surfaces.

Wireless applications in a mmW band require a resonator with a high quality (Q) factor (e.g., Q≥100). That is, the ratio of the energy stored in the resonator should be large compared to the power lost at the resonant frequency. The resonant frequency may vary depending on the application. For example, wireless communication (e.g., 5G communication) may utilize mmW signals in mmW bands around 28 gigahertz (GHz) (e.g., 27 GHz<f<29 GHz) or around 43 GHz (e.g., 37 GHz<f<43 GHz). Additionally, radar (e.g., automotive radar) may utilize mmW signals in mmW bands around 24 GHz, 77 GHz, or 79 GHz. The high Q values are difficult to achieve using a conventional Si radio frequency (RF) Integrated Passive Device (IPD) manufacturing process. Typical resonators formed through this process typically only result in a Q of around 40, whereas resonators formed using the disclosed techniques may have a Q in excess of 100 (e.g., close to 200).

The manufacturing method disclosed herein can provide a high-Q, GaN compatible SIW resonator with precise dimensions. The manufacturing method generally has the following elements. First, a high resistivity silicon substrate is utilized to provide a low dielectric loss and compact transverse dimensions. Second, a (gold) lift-off process is utilized to dispose a top metal layer (i.e., top conductor) for packaging with a GaN Die. Third, a through silicon via (TSV) process and a Cu redistribution (RDL) line process are used to form vias of a diameter and pitch (i.e., <λ/4) to meet the requirements of mmW operation.

The method (i.e., process) can produce a high Q resonator with a Q≈200 that can, for example, meet a 5G mmW filter requirement and that is compatible with GaN die packaging, which typically provides gold metal for contact. The disclosed manufacturing process provides an alternative to SIW manufacturing processes based on through glass vias (TGV) or printed circuit board (PCB) vias. The disclosed manufacturing process offers an improvement to these technologies for mmW applications for a few reasons. First, glass substrates are fragile and have low thermal conductivity, which limits the possible application of a mmW SIW based on TGVs. Second, PCB vias are imprecise at mmW frequencies, which limits performance of a mmW SIW based on PCB and limits the repeatability of a PCB via manufacturing process. The disclosed process remedies these problems, is suitable for both 6 inch and 8 inch wafer fabrication, and does not require new tooling. Therefore, the disclosed method can be cost efficient and easily integrated with the fabrication of other products.

Figure 2:
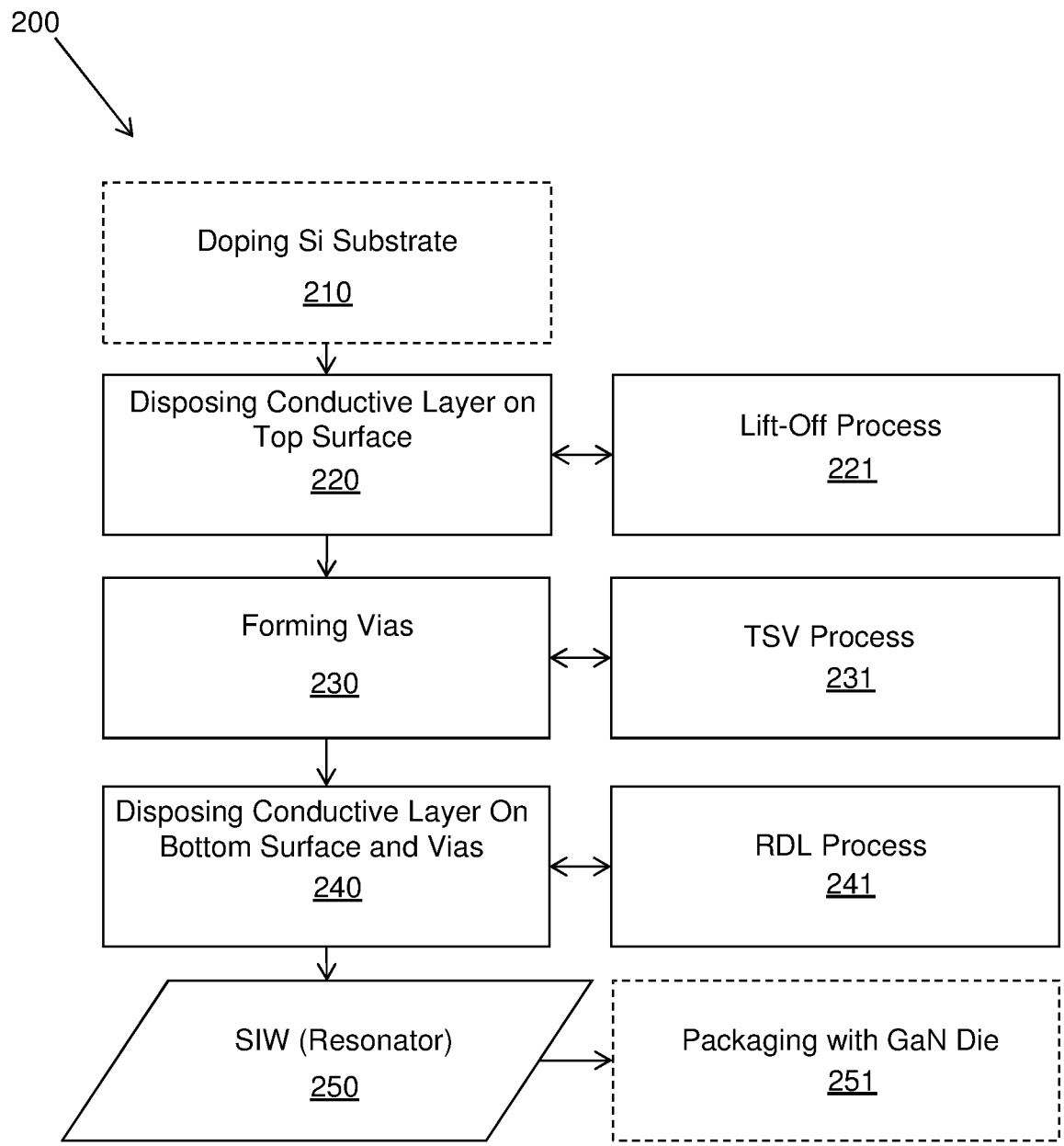
FIG. 2 is a flow chart of a manufacturing process for a SIW according to an implementation of the present disclosure.

A flow chart of a manufacturing process for a SIW (e.g., SIW resonator) according to an implementation of the present disclosure is shown in FIG. 2. The method includes disposing 220 a conductive (e.g., gold) layer on top surface of a silicon substrate using a lift-off process 221.

The silicon substrate may, in some implementations, be doped 210 to form a high resistivity silicon substrate that has a bulk resistivity in the range of 1000-7000 Ohm-cm. High resistivity Si provides a low dielectric loss and a high dielectric constant (e.g., $\varepsilon_r$=11.9). The low dielectric loss improves cavity Q, and the high dielectric constant decreases the transverse cavity dimension.

The lift-off process 221 refers to the process of exposing a pattern on photoresist, depositing a thin film (e.g., gold) over the entire area, then washing away the photoresist to leave behind the film only in the patterned area. Steps of the lift-off process 221 are illustrated in FIGS. 3A-3D. The lift-off process utilizes a sacrificial photoresist layer to add metal (i.e., an additive process). This is in contrast with conventional techniques that deposit a conductive (i.e., metal) layer over an entire surface first and then etch away unwanted portions of the metal (i.e., a subtractive process). The additive lift-off process generally provides smoother metal edges than the subtractive etching process, which usually has bite shaped artifacts at the metal edges. Accordingly, it is easier to control critical dimension (CD) using the lift-off process.

Figure 3A:
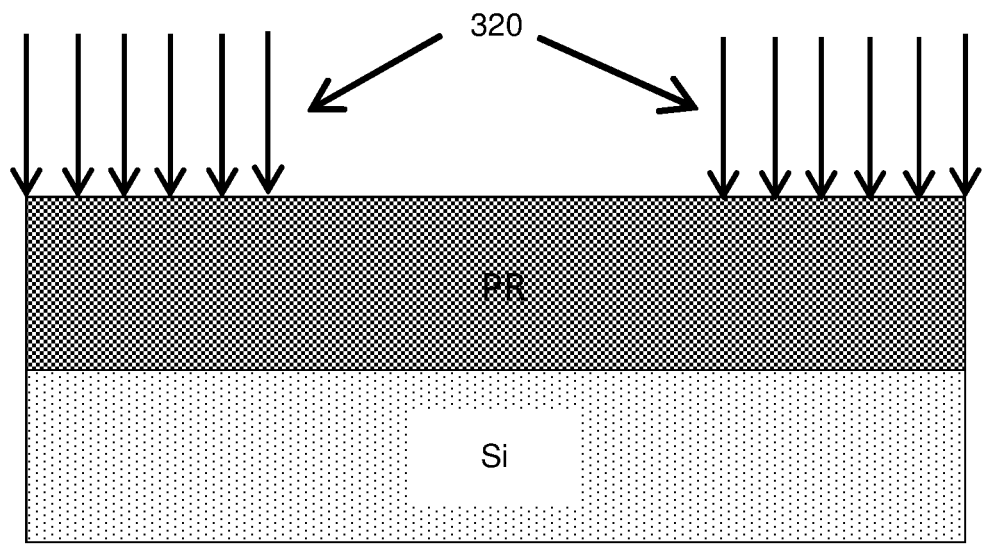
FIGS. 3A-3D graphically illustrate steps of the lift-off process of FIG. 2 according to an implementation of the present disclosure.

As shown in FIG. 3A, the lift-off process includes disposing a layer of photoresist (PR) on a top surface of a Si substrate and exposing the PR with light having a spatial pattern 320. A negative photoresist (i.e., portions exposed to light become insoluble to the photoresist developer) is used for the lift-off process because a reproducible undercut 310 (i.e., profile) may be formed at the edges of exposure.

Figure 3B:
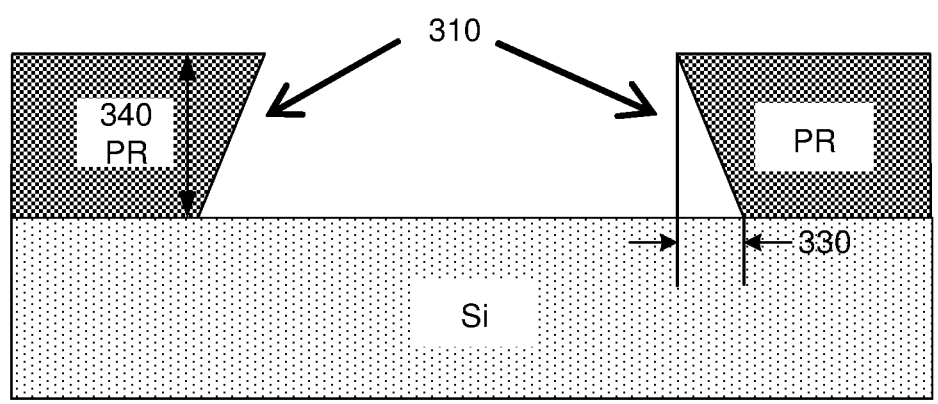

FIG. 3B graphically illustrates the results of developing the photoresist. Undercut profiles 310 are created by controlling the exposure (i.e., exposure dose) experienced by the photoresist. Based on the controlled exposure and the penetration depth of the PR, the crosslinking of the PR may be spatially controlled to create an undercut (i.e., retrograde) edge profile 310 upon developing the PR (e.g., in an aqueous alkaline solution). The undercut profile 310 is important because it reduces or eliminates gold from being deposited on the edges of the photoresist, which could otherwise make removal (i.e., lift off) of the photoresists difficult. Additionally, the dimensions of the undercut profile (i.e., the undercut 330 and the thickness 340) can be controlled to provide metal edges having the accuracy necessary for mmW signals.

As shown in FIG. 3B, after developing, the top surface of the substrate has portions (i.e., areas) that are covered with PR and areas that are not covered with PR. The areas of the top surface that not covered with PR are exposed to a subsequent metal deposition and therefore may be referred to as exposed areas, though in this case the term "exposed areas" is related to being unconverted by PR rather than being illuminated with light. For the lift off process the thickness 340 of the PR is larger than the thickness 350 of the layer of metal disposed (e.g., $\frac{1}{2} PR_{thickness} < metal_{thickness} < \frac{2}{3} PR_{thickness}$). In some implementations, the thickness of the PR may be in the range of 5 to 6 microns (μm).

Figure 3C:
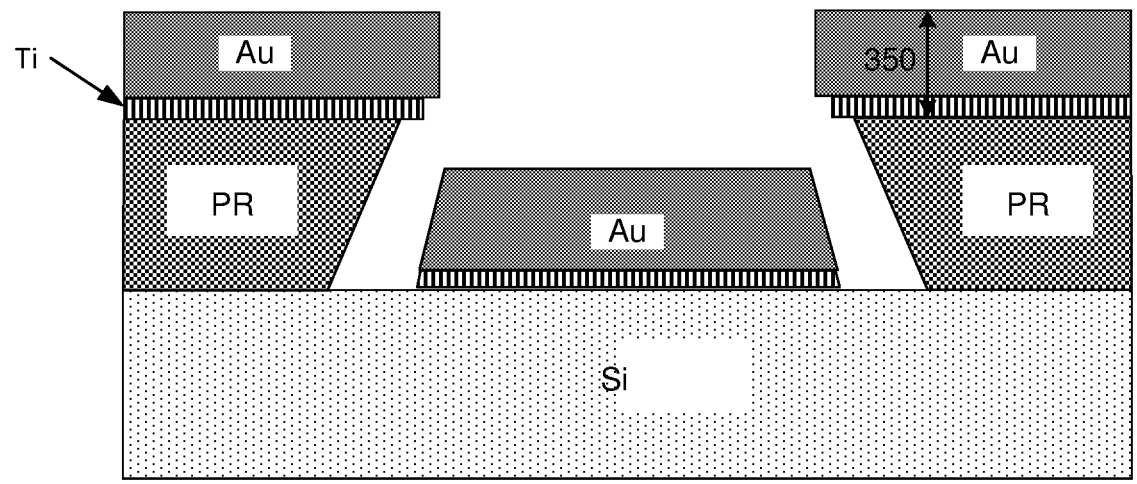

FIG. 3C illustrates disposing one or more layers of metal on the PR and the exposed areas of the top surface of the silicon substrate. As shown, the edge profile 310 of the PR prevents the PR from being completely covered with metal during the metal deposition process. The metal layer may be a single gold (Au) layer that is disposed using a metal deposition method (e.g., vapor deposition). The crosslinked resin of the negative PR maintains the undercut edge profile 310 even at the high coating temperatures during vapor deposition.

In some implementations a layer of titanium (Ti) 351 is disposed onto the top surface of the substrate before disposing the layer of gold. The Ti layer can help adhere the Au layer to the Si (or SiO$_2$) substrate. Additionally, the Ti layer may work as a diffusion barrier to the Si.

Figure 3D:
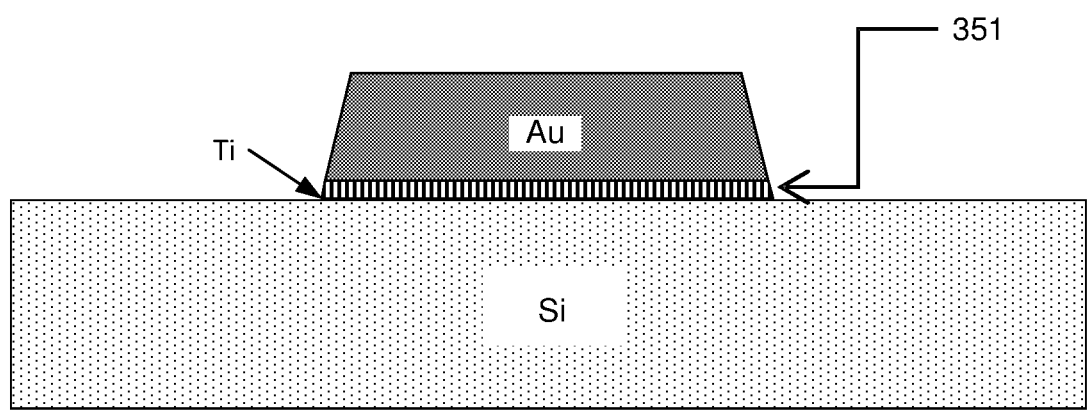

FIG. 3D illustrates the step removing the gold (or gold plus titanium) covered photoresist to obtain a silicon substrate having a layer of Au on one or more of the exposed areas on the top surface. This step includes washing away the photoresist (e.g., using a resist stripper) so that what remains is the Au layer (or Au layer and Ti layer) in a pattern on the top surface that corresponds to the light exposure spatial pattern 320 of FIG. 3A. In some implementations, the thicknesses of the gold layer may range from 2.5 μm to 4 μm, while the thickness of the titanium is around 300 angstroms (i.e., 0.03 μm).

In some implementations it is not necessary for the Au layer to make perfect contact with the substrate. For example, a gap of a few microns, due to a non-ideal fabrication process, may be tolerable in certain application (e.g., SIW resonator). This tolerance is well suited for high volume environments.

Returning to the flow chart of a manufacturing process for a SIW shown in FIG. 2. The method also includes forming vias 230 in the silicon substrate using a through silicon via (TSV) process 231.

The TSV process 231 refers to the process in which a vertical electrical connection (i.e., via) that passes through a silicon substrate is created. The steps of the TSV process 231 are illustrated in FIGS. 4A-4C.

Figure 4A:
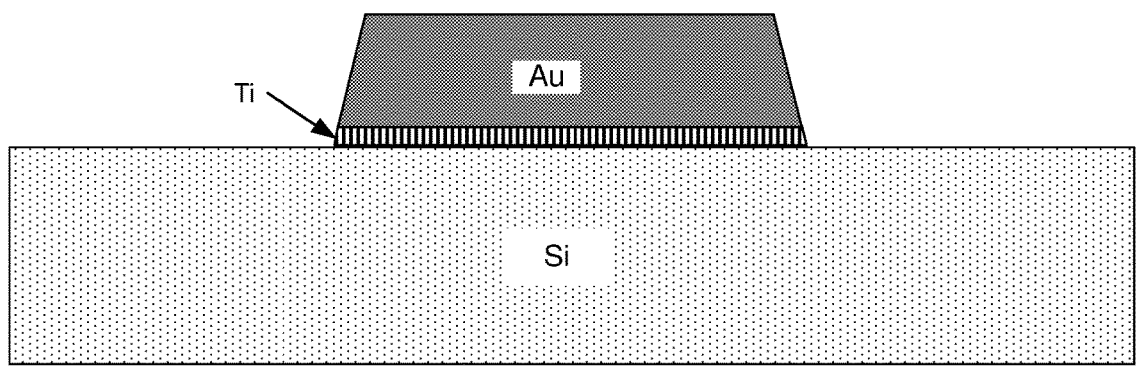
FIGS. 4A-4C graphically illustrate steps of the through silicon via (TSV) process of FIG. 2 according to an implementation of the present disclosure.
Figure 4B:
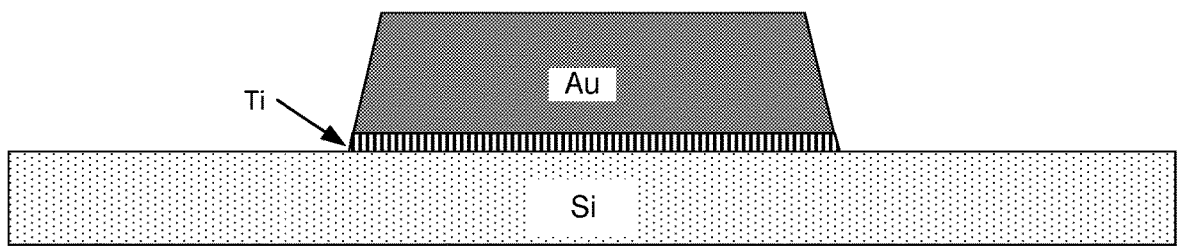
Figure 4C:
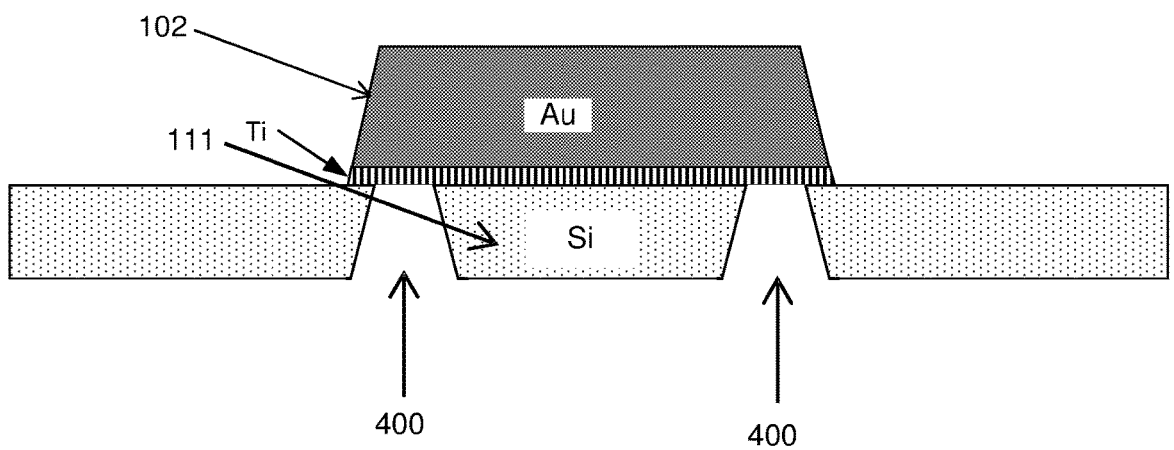

As shown in FIGS. 4A-4B the substrate (e.g., Si wafer) with a top conductor (i.e., the results of the lift-off process) is made thinner by grinding the bottom surface. While a thicker substrate may offer better performance for the lift-off process, a thinner substrate facilitates etching. In addition, the substrate thickness corresponds to the height of the SIW. The height of the SIW is a design element that affects the electrical performance of the SIW. Thus, back grinding the substrate allows for precise control of the substrate height for both the TSV process and the electrical performance of the SIW. The thickness of the Si substrate may be ground down to a height less than 250 micrometers (e.g., 150 μm) for a SIW resonator at a mmW frequency.

The locations of each via are determined based on an SIW design as described above, and defined in a photoresist layer that exposes via areas to etchants during etching. The vias are etched in the substrate (e.g., using ion etching, wet chemical etching, etc.) from the bottom surface to the top surface (i.e., surface with top conductor 102) to produce channels 400 through the substrate 111, such as shown in FIG. 4C. The top conductor 102 covers the via at the top surface of the substrate 111.

Returning to the flow chart of a manufacturing process for a SIW shown in FIG. 2. The method also includes disposing 240 a conductive (e.g., copper) line (i.e., layer) on the bottom surface and vias using a redistribution line (i.e., layer) process 241.

The redistribution line (i.e., RDL) process 241 refers to a process for disposing a layer of copper to cover the bottom surface of the substrate and the interior surfaces of the vias in a single step. The RDL is electroplating process to create a thick (e.g., ≥5 μm) layer of copper. In some implementations, the RDL process uses a seed Cu layer deposition followed by electroplating. The electroplating may use a chemical electrolyte method to deposit Cu on Si, where the Cu seed layer is positive (+) and the Si substrate is negative (−).

The results of the RDL process 241 is a conductive layer (e.g., copper) covering a bottom surface of the substrate the interior surfaces of the vias 240. As shown in FIG. 2, the SIW (e.g., SIW resonator) 250 is complete after the RDL process.

Figure 5:
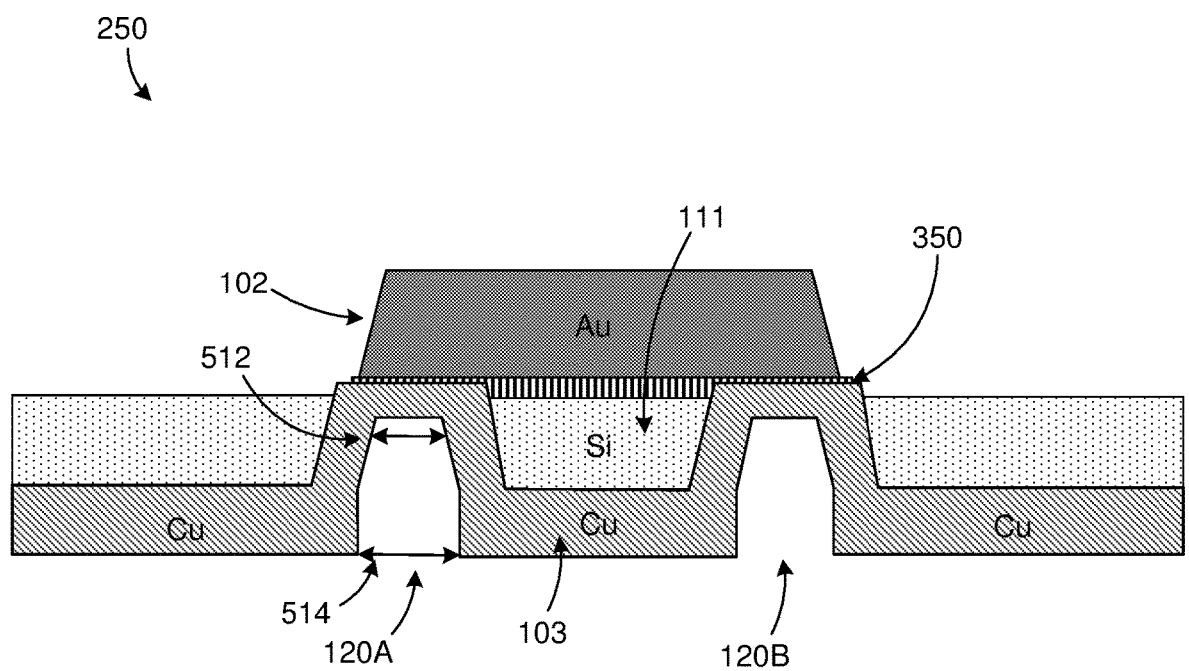
FIG. 5 graphically illustrates the redistribution line (RDL) process of FIG. 2 according to an implementation of the present disclosure.

A cross section of the SIW 250 is illustrated in FIG. 5. As shown, the top conductor 102 (e.g., gold layer) disposed on the top surface of the substrate comes into contact with the copper bottom conductor 103 (e.g., copper layer) at each via 120A, 120B. Additionally, the interior surfaces of the vias are plated with copper. Thus, the vias electrically connect the top conductor to the bottom conductor. The vias 120A, 120B resulting from the TSV process have a shape like a truncated cone in a cut plane transverse to the plane of the top surface of the substrate. The vias are typically circular and have a top diameter 512 that is smaller than a bottom diameter 514. For example, the top diameter may be 80 μm while the bottom diameter may be 220 μm for a SIW resonator at a mmW frequency (e.g., 28 GHz). The change in diameter over the length of each is much smaller than the overall resonator size (e.g., a cavity in the millimeter range). Accordingly, this variation does not significantly affect the operation of the SIW resonator and an average diameter of the vias (i.e., 150 μm) may be assumed for design purposes.

The process steps described thus far are used to manufacture a SIW 250. The manufactured SIW may (or may be configured to) resonate at a particular mmW frequency in the range of 27 to 29 GHz. For example, a SIW resonator that is resonant at 28 GHz may have a cavity, formed by a gold top conductor 102, a copper bottom conductor 103, and two parallel rows of copper plated vias 120, 121 that run through a high resistivity silicon substrate with a dielectric constant of 11.9. The cavity has a width 106 of 2.2 millimeters, a height 107 of 150 micrometers, and a length 105 of 2.2 millimeters. The pitch (i.e., spacing between pairs) of the vias in each of the rows 120, 121 may be 250 μm and the diameters of each via may be 150 μm. The cavity of the SIW resonator described is resonant at a frequency close to or at 28 GHz.

The SIW 250 (i.e., bulk cavity resonator/waveguide) may be generally described as having a unit cell length of less than 3 millimeters, a width of less than 3 millimeters and a height that is less than 250 microns. The SIW 250 can operate either in either a Transverse Electric (TE) or a Transverse Magnetic (TM) electromagnetic mode. The TE/TM mode requires a boundary condition that all conducting walls are surrounded, and the substrate integrated waveguide (SIW) supports the TE/TM electromagnetic mode with sidewalls having periodic conductive vias at TSV pitch of less than ¼ wavelength (λ).

Figure 6A:
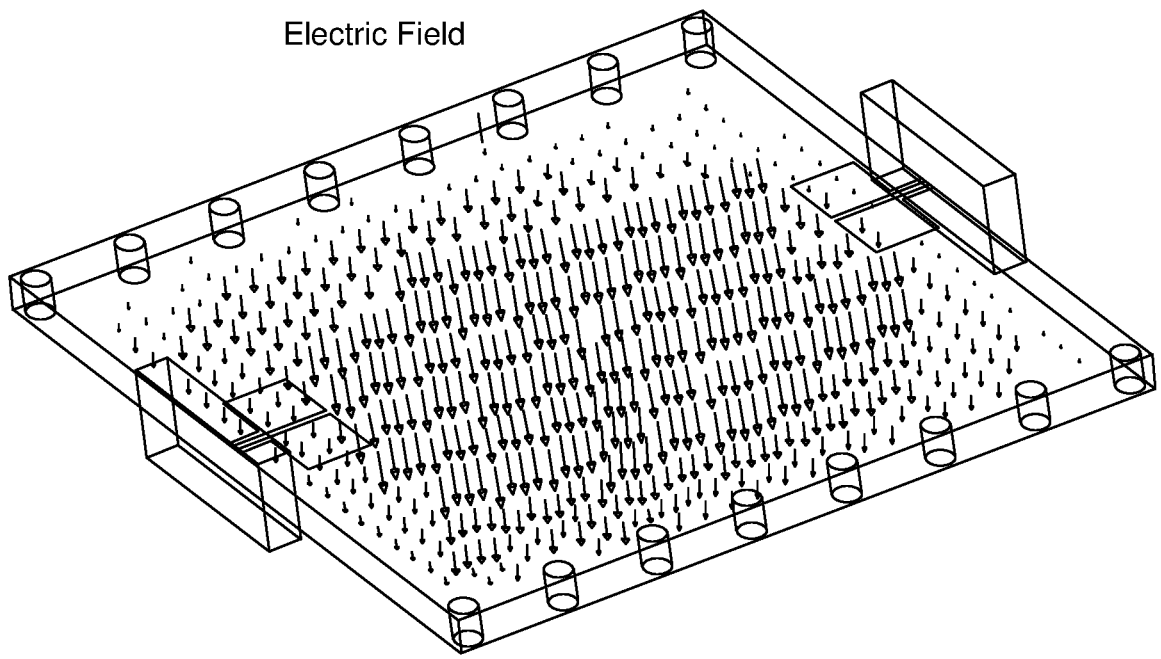
FIG. 6A is a perspective view of a SIW resonator illustrating simulated electric fields (E-fields) at 28 GHz according to an implementation of the present disclosure.
Figure 6B:
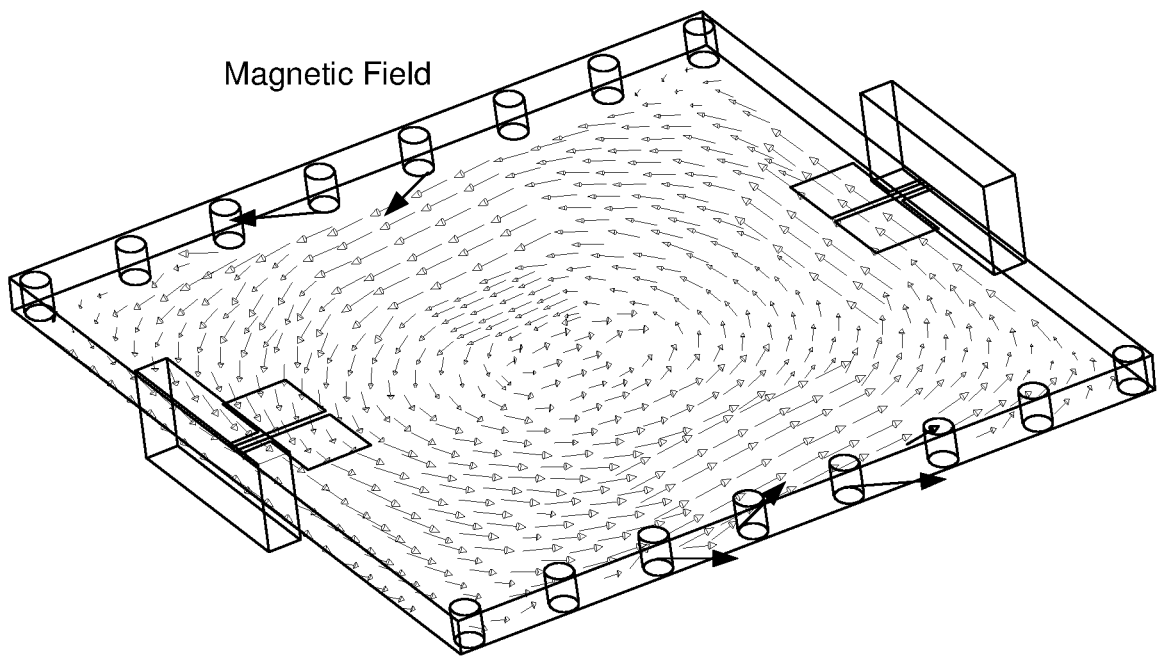
FIG. 6B is a perspective view of a SIW resonator showing simulated magnetic fields (H-fields) at 28 GHz according to an implementation of the present disclosure.

The operation/performance of the SIW resonator described above can be shown through simulation. FIG. 6A is a perspective view of a SIW resonator with the characteristics described above showing with simulated electric fields (arrows) at 28 GHz. As shown, the arrows become vanishingly small at the sidewalls of the resonant cavity, thereby proving that the rows of vias act as conductive walls. FIG. 6B is the same view of the resonator but with simulated magnetic fields (arrows) at 28 GHz. A Q of the 28 GHz SIW resonator is greater than 100 (i.e., close to 200).

Returning to the flow chart of a manufacturing method 200 for a SIW shown in FIG. 2. In some implementations, the method further includes packaging 251 the SIW (e.g., SIW resonator) with a GaN die. GaN can be used for devices (e.g., power amplifiers) in mmW bands (e.g., at 28 GHz). Gold is generally used as the primary contact metal on die for these devices (e.g., due to thermal concerns). It is important to form an electrical connection with a gold contact using gold. If aluminum (Al) is used as an alternative, for example, the Au and Al can react to form intermetallic compounds (e.g., Au$_2$Al), which increase the resistivity of the connection. Additionally, diffusion at inter-metal contacts reduces reliability. The method 200 described herein uses a gold conductive layer 102 for the purpose of making an electrical contact (i.e., packaging) with a GaN die that avoids intermetallic compounds and diffusions problems.

Figure 7:
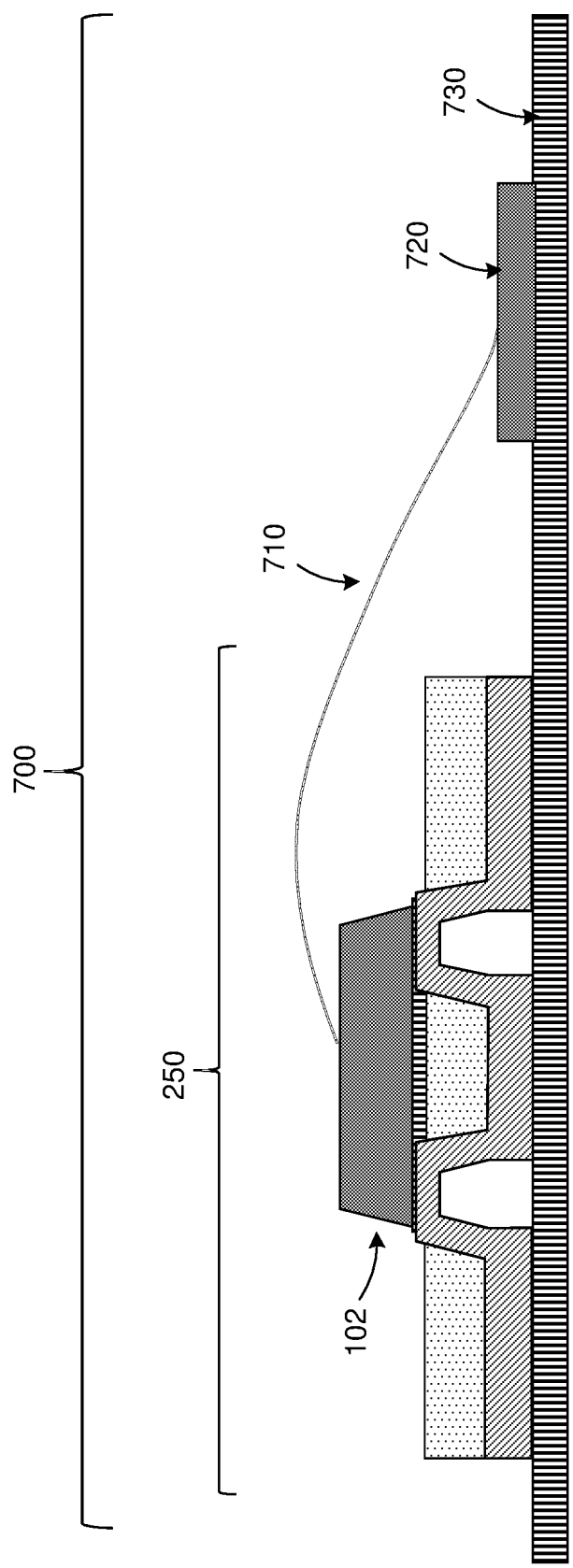
FIG. 7 graphically illustrates the packaging with a GaN Die of FIG. 2 according to an implementation of the present disclosure.
Figure 8:
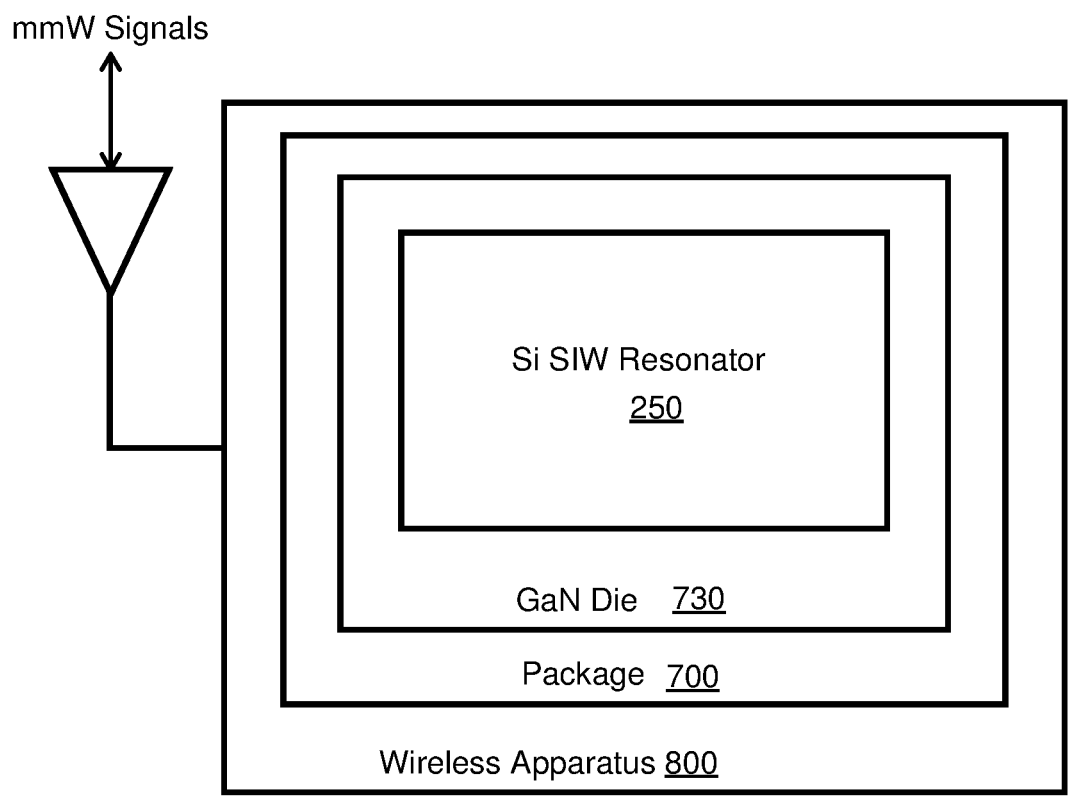
FIG. 8 is a block diagram of a wireless apparatus with a SIW resonator according to an implementation of the present disclosure.

FIG. 7 graphically illustrates the step of packaging 251 with a GaN Die according to an implementation of the disclosure. As shown, the top conductor 102 (gold layer) of the SIW resonator is connected, using wire (or ribbon) bonding 710, to a gold contact 720 on a GaN die.

The SIW resonator packaged with the GaN die may be included in a wireless apparatus 800. The wireless apparatus 800 may be a wireless communication device (e.g., smart phone) that transmits and receives mmW signals for communication. In this case, the mmW signals can be 5G wireless communication signals. The wireless apparatus may also be a radar that transmits and receives mmW signals for range detection. In this case, the mmW signals can be automotive radar signals. The package 700 including the GaN die (e.g., with a power amplifier) and the Si SIW resonator may be included as part of the wireless apparatus to provide function such as the generation or the filtering of the mmW signal at a frequency (e.g., 28 GHz) in a band (e.g., 5G communication band) of operation.

In the specification and/or figures, typical implementations have been disclosed. The present disclosure is not limited to such exemplary implementations. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Those skilled in the art will also appreciate that various adaptations and modifications of the preferred and alternative implementations described above can be configured without departing from the scope and spirit of the disclosure. Therefore, it is to be understood that, within the scope of the appended claims, the disclosure may be practiced other than as specifically described herein.

The invention claimed is:

1. A substrate integrated waveguide (SIW) resonator, comprising:
vias etched in a silicon substrate using a through-silicon-via etching process;
a gold layer disposed on a top surface of the silicon substrate; and
a copper layer disposed on a bottom surface of the silicon substrate and on interior surfaces of each via, wherein a separation between the copper layer and the gold layer defines a height of the SIW resonator, and wherein the vias include vias that are arranged in a first pair of parallel rows and a second pair of parallel rows, the first pair of parallel rows being orthogonal to the second pair of parallel rows and having a separation that defines a width of the SIW resonator, the second pair of parallel rows having a separation that defines a length of the SIW resonator, wherein:
a row of the first pair of parallel rows or the second pair of parallel rows includes at least one port configured to couple a millimeter wave signal in and out of the SIW resonator; and
a pitch of the vias in an area of each port is larger than a pitch of vias not in the area of each port.

2. The SIW resonator according to claim 1, wherein the SIW resonator is configured by the length, the width, the height, and the silicon substrate to resonate at a millimeter wave frequency.

3. The SIW resonator according to claim 2, wherein the silicon substrate is doped to increase a resistivity and a dielectric constant at the millimeter wave frequency.

4. The SIW resonator according to claim 3, wherein the resistivity is greater than 1000 ohm-centimeter at the millimeter wave frequency.

5. The SIW resonator according to claim 3, wherein the dielectric constant is greater than 10 at the millimeter wave frequency.

6. The SIW resonator according to claim 2, wherein the millimeter wave frequency is in a range of 27 to 29 gigahertz (GHz).

7. The SIW resonator according to claim 2, wherein the millimeter wave frequency is in a range of 37 to 43 gigahertz (GHz).

8. The SIW resonator according to claim 2, wherein the millimeter wave frequency corresponds to a fifth generation (5G) wireless communication signal.

9. The SIW resonator according to claim 2, wherein the millimeter wave frequency corresponds to an automotive radar signal.

10. The SIW resonator according to claim 2, wherein the SIW resonator has a quality (Q) factor that is greater than 100 at the millimeter wave frequency.

11. The SIW resonator according to claim 2, wherein a pitch of the vias in the first pair of parallel rows and in the second pair of parallel rows is less than or equal to a quarter of a wavelength of the millimeter wave frequency.

12. The SIW resonator according to claim 11, wherein a pitch of the vias in each of the first pair of parallel rows and in each of the second pair of parallel rows is less than 500 micrometers.

13. The SIW resonator according to claim 12, wherein a diameter of the vias in each of the first pair of parallel rows and in each of the second pair of parallel rows is a fraction of the pitch.

14. The SIW resonator according to claim 13, wherein the fraction of the pitch is in a range from one third of the pitch to two thirds of the pitch.

15. The SIW resonator according to claim 2, wherein the width is less than 3 millimeters and the height is less than 250 micrometers.

16. The SIW resonator according to claim 1, wherein the gold layer includes a wire bond connecting the gold layer on the top surface of the silicon substrate to a gallium nitride (GaN) die.

17. A substrate integrated waveguide (SIW) resonator, comprising:
vias etched in a silicon substrate using a through-silicon-via etching process;
a gold layer disposed on a top surface of the silicon substrate; and
a copper layer disposed on a bottom surface of the silicon substrate and on interior surfaces of each via, wherein a separation between the copper layer and the gold layer defines a height of the SIW resonator, and wherein the vias include vias that are arranged in a first pair of parallel rows and a second pair of parallel rows, the first pair of parallel rows being orthogonal to the second pair of parallel rows and having a separation that defines a width of the SIW resonator, the second pair of parallel rows having a separation that defines a length of the SIW resonator, wherein:

the SIW resonator is configured by the length, the width, the height, and the silicon substrate to resonate at a millimeter wave frequency, the silicon substrate being doped to increase a resistivity and a dielectric constant at the millimeter wave frequency.

18. A substrate integrated waveguide (SIW) resonator fabricated using wafer-fabrication processes, the SIW resonator comprising:
   a substrate that is doped to reduce a dielectric loss and to increase a dielectric constant of the substrate;
   a gold layer disposed on a top surface of the substrate using a lift-off wafer-fabrication process;
   vias formed in the substrate using a through silicon via (TSV) wafer-fabrication process; and
   a copper layer disposed on a bottom surface of the substrate and on interior surfaces of each via using a redistribution line (RDL) wafer-fabrication process, wherein a guide area defined by the substrate, the gold layer, the vias, and the copper layer, resonates at a millimeter wave frequency.

19. The SIW resonator according to claim 18, wherein: a separation between the copper layer and the gold layer defines a height of the SIW resonator, and wherein the vias include vias that are arranged in a first pair of parallel rows and a second pair of parallel rows, the first pair of parallel rows being orthogonal to the second pair of parallel rows and having a separation that defines a width of the SIW resonator, the second pair of parallel rows having a separation that defines a length of the SIW resonator.

20. The SIW resonator according to claim 18, wherein the wafer-fabrication processes are compatible with a 6-inch or an 8-inch silicon wafer.

* * * * *